(12) United States Patent
Ikeda et al.

(10) Patent No.: US 6,379,226 B1
(45) Date of Patent: Apr. 30, 2002

(54) METHOD FOR STORING CARRIER FOR POLISHING WAFER

(75) Inventors: Masaaki Ikeda, Utsunomiya; Ichiro Yoshimura, Ustonomiya, both of (JP)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/869,084

(22) PCT Filed: Dec. 8, 1999

(86) PCT No.: PCT/US99/29078

§ 371 Date: Jul. 20, 2001

§ 102(e) Date: Jul. 20, 2001

(87) PCT Pub. No.: WO00/39841

PCT Pub. Date: Jul. 6, 2000

(51) Int. Cl.⁷ .................................................. B24B 1/00
(52) U.S. Cl. .......................... 451/41; 451/287; 451/339
(58) Field of Search .......................... 451/41, 287, 288, 451/339

(56) References Cited

U.S. PATENT DOCUMENTS 5,133,160 A * 7/1992 Lampert et al. ............... 451/78
5,616,212 A * 4/1997 Isobe .......................... 451/287
5,698,040 A   12/1997 Guldi et al.
6,126,517 A * 10/2000 Tolles et al. .................. 451/41
6,296,546 B1 * 10/2001 Allen et al. .................. 451/288

FOREIGN PATENT DOCUMENTS

| EP | 0 740 329 A1 | 10/1996 |
| EP | 0 833 375 A2 | 4/1998 |
| EP | 0 787 562 B1 | 12/1999 |
| JP | 06226618 | 8/1994 |

* cited by examiner

*Primary Examiner*—Derris H. Banks
*Assistant Examiner*—Hadi Shakeri
(74) *Attorney, Agent, or Firm*—Senniger, Powers Leavitt & Roedel

(57) ABSTRACT

To provide a method for storing a carrier (3) for polishing a silicon wafer, which can store the carrier (3) in a manner to reduce scratches on the silicon wafer. The method includes storing a carrier (3) for use in polishing a silicon wafer completely immersed in a liquid. At least a substantial portion of the liquid is deionized water.

13 Claims, 2 Drawing Sheets

METHOD FOR STORING CARRIER FOR POLISHING WAFER

BACKGROUND OF THE INVENTION

The present invention relates to a method for storing a carrier used in polishing a silicon wafer. In some polishing processes, both surfaces of the wafer are polished simultaneously.

In recent years, attention has been paid to polishing silicon wafers, particularly on both its surfaces simultaneously. However, there is a serious problem of a scratch occurring on the silicon wafer during polishing.

The major cause of the formation of such scratches is attributed to a carrier and a pin sleeve for driving the carrier. Such a carrier and pin arrangement is disclosed in Japanese Patent Application 8-096166. Improvements have been made on these members to reduce the incident rate of scratches.

However, as such improvements proceed, the specifications for allowable scratching have become more restrictive with fewer and smaller being permitted. Thus, even more improvement is needed requiring even stricter controls on the carriers.

Carriers have hitherto been stored in a dry condition, for example, as shown in FIG. 3, where carriers 3 are placed horizontally on a plurality of carrier setters 2 disposed on rollers 4 in a carrier repository 1.

It has been found that because of such dry storage, scratches continue to occur at unacceptable levels. Further, the number of scratches on a silicon wafer increases with the number of times a carrier is used in the polishing process. It is believed that the scratches are caused by contaminants such as residual abrasive slurry on the carriers that become involved with a silicon wafer that is subjected to polishing at the time when a carrier is replaced with a stored one. Contaminants may also become involved as a result of the use of an entirely new carrier.

In view of the aforementioned problems, the present invention aims to provide a method for storing a wafer polishing carrier, which carrier is stored in a manner that will reduce scratches on a silicon wafer which scratches are created during polishing the silicon wafer particularly when polished on both of its surfaces simultaneously.

SUMMARY OF THE INVENTION

The present invention provides for a method of polishing a silicon wafer that results in fewer scratches on the wafer; the provision of such a method of using a wafer carrier that can be utilized with current polishing equipment without significant modification; the provision of such a method that is economical to use; and the provision of such a method that can be used in wafer polishing processes that polish both sides of a wafer simultaneously.

The present invention provides a method for storing a carrier used in polishing a silicon wafer. The method includes storing the carrier completely immersed in a liquid containing deionized water prior to use with a wafer in a wafer polishing step.

Other objects and features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF PREFERRED EMBODIMENTS

Figure 1:
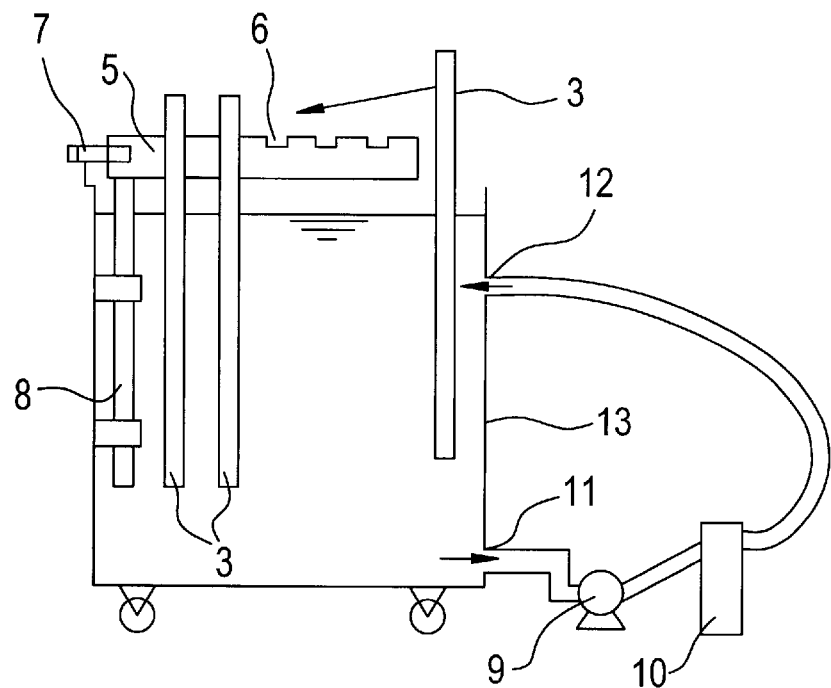
FIG. 1 is a schematic explanatory view showing an embodiment of a method for storing a carrier of the present invention.

The present invention provides a method for storing a carrier that is used during the silicon wafer polishing step of the polishing process. The wafers are preferably simultaneously polished on both surfaces. The method includes storing the carrier completely immersed in a storage liquid such deionized water or a liquid mixture including deionized water prior to use in the polishing step.

It is preferable that the storage liquid be at a temperature in the range of about 20° C. through about 80° C. during storage of the carriers. It is also preferred that the storage liquid be subjected to filter-circulation cleaning during carrier storage, however, it is envisioned that the storage liquid may be filtered at other times in addition to or instead of during carrier storage.

According to the present invention, there is provided a further method for storing a carrier for simultaneously polishing both surfaces of silicon wafer, characterized in that the carrier is stored completely immersed in storage liquid including a mixture of liquids and also one or more liquids containing dissolved solids. The major component of the storage liquid is deionized water.

It is preferable that the following components be added to the deionized water to obtain the liquid mixture and added in the indicated amounts by weight of deionized water:

surface active agent (0.1–5% by weight);

aqueous ammonia and hydrogen peroxide; and surface active agent (0.1–5% by weight+aqueous ammonia and hydrogen peroxide).

The surface active agent may be a soluble solid.

In the present invention, the storage liquid has pH preferably of 7–12. Further, the storage liquid is preferably subjected to filter-circulation cleaning.

In a method of the present invention, a carrier and a brush for cleaning abrasive polishing pads are stored under the condition that a carrier and a brush are completely immersed in the storage liquid.

As described above, in a method for storing a carrier of the present invention, a carrier is stored completely immersed in storage liquid. Therefore, the carrier can be stored and removed from storage in a clean condition since the carrier can be isolated from contaminants. In addition, the carrier can be easily washed of contaminants since contaminants are preferably not allowed to dry on the carrier and do not adhere as readily to the carrier even if the carrier is initially contaminated. Thus, the contaminants available to cause scratches during polishing are reduced as is the number of scratches.

The method of the present invention can be applied not only to the aforementioned carrier for polishing, but also to a brush used to clean an abrasive polishing pad.

Deionized water used in the present invention is preferably super deionized water refined by the use of an electric recuperation type ion-exchanger in which an ion-exchange resin and an ion-exchange film are used in combination or refined with a reverse permeation apparatus.

The liquid mixture of the present invention is preferably prepared by adding a surface active agent in an amount of about 0.1–5% by weight (absent any water) of deionized water in the resulting mixture.

This can impart an effect of washing contaminants (particularly, particles) adhered to the carrier into the storage liquid and then removed by filtering. Generally, a volume ratio of aqueous ammonia:aqueous hydrogen peroxide:deionized water is controlled within the approximate range of from 1:1:10 to 1:1:200.

A surface active agent usable in the present invention is selected from cationic surface-active agents, anionic surface-active agents, nonionic surface-active agents and amphoteric surface-active agents. Nonionic surface-active agents and amphoteric surface-active agents are preferable for removing contaminants.

Next, a method for storing a carrier of the present invention is described in detail.

FIG. 1 is a schematic explanatory view showing an embodiment of a method for storing a carrier of the present invention.

As shown in FIG. 1, a vessel 13 for storing a carrier is filled with storage liquid which is preferably first filter-cleaned.

A part of the aforementioned deionized water or liquid mixture (storage liquid) is introduced to a filter 10 from a water-suction port 11 arranged at the bottom of the vessel 13 by the use of a circulation pump 9, filter-cleaned by the filter 10, and continuously supplied to the vessel 13 through a water-supply port 12 arranged in the upper portion of the vessel 13.

As the filter 10, it is preferable to use a filter of 0.05–1.0 $\mu$m filtration.

As described above, since deionized water or liquid mixture from which contaminant particles are sufficiently removed is constantly circulated in the vessel resulting in substantially no particles adhering to a carrier even if particles are introduced into the vessel during placement of a carrier into or removal of a carrier from the vessel. A carrier should be placed in the vessel before drying after use to help in particle removal from the carrier. Because the particles are not dry, they do not readily adhere to the carrier and even if particles adhere to the carrier, the carrier can be easily washed away prior to use or reuse of the carrier.

It is preferable that a carrier is taken out of and placed in the vessel for storing a carrier by the use of, for example, an arm 5 shown in FIG. 1.

The arm 5 includes a plurality of grooves 6 each for holding a carrier 3, a stopper 7 fixing the arm 5 during a time when the arm 5 is positioned for removing or introduction a carrier, and a supporting portion 8 capable of supporting the arm 5 at predetermined portions of the vessel 13 in such a manner that the arm 5 (or the supporting portion 8) can slide up and down.

Figure 2:
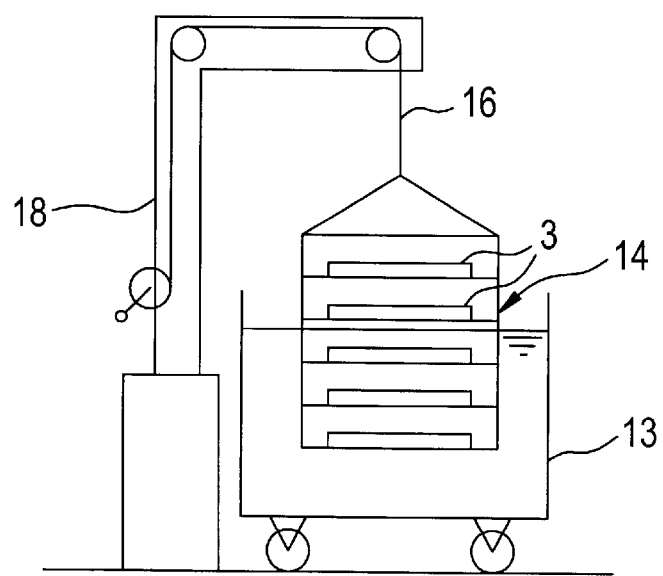
FIG. 2 is a schematic explanatory view showing another embodiment of a method for storing a carrier of the present invention.

The carrier 3 may be introduced into the vessel for storing the carrier immersed in the storage liquid. For example, a carrier 3 may be suspended from a rack-shaped repository shelf 14. The shelf is suspended in the vessel 13 as with a wire 16 which is also connected to a winch means 18 and operable to move the shelf up and down to predetermined positions within the vessel 13 as shown in FIG. 2.

It is preferable that the wire 16 be made of a material having low dusting characteristics. For example, nylon or the like can be suitably used as the material.

With regard to the vessel 13 storing a carrier, it is preferable that an open top of the vessel 13 be normally sealed during carrier storage to prevent particles in the ambient atmosphere from being introduced into the vessel 13. It is also preferred the vessel 13 be disposed in a clean air environment such as in a clean room.

The present invention is described in more detail on the basis of Examples. However, the present invention is by no means limited to these Examples.

The rate of occurrence of scratches (count/sl) per a silicon wafer was obtained by subjecting silicon wafers to eye-observation in a darkroom by the use of collimate light having a luminous intensity of $10^5$ lux and determining observable scratches as scratches caused by contaminants.

A carrier 3 was stored, by use of the vessel 13 shown in FIG. 1 in such a manner that it was completely immersed in deionized water having a temperature of 40° C. while circulating deionized water cleaned by the filter 10 (1.0 $\mu$m filtration filter).

Then, a silicon wafer was subjected to polishing (normal manner) several times on both surfaces simultaneously by the use of the aforementioned carrier.

Figure 4:
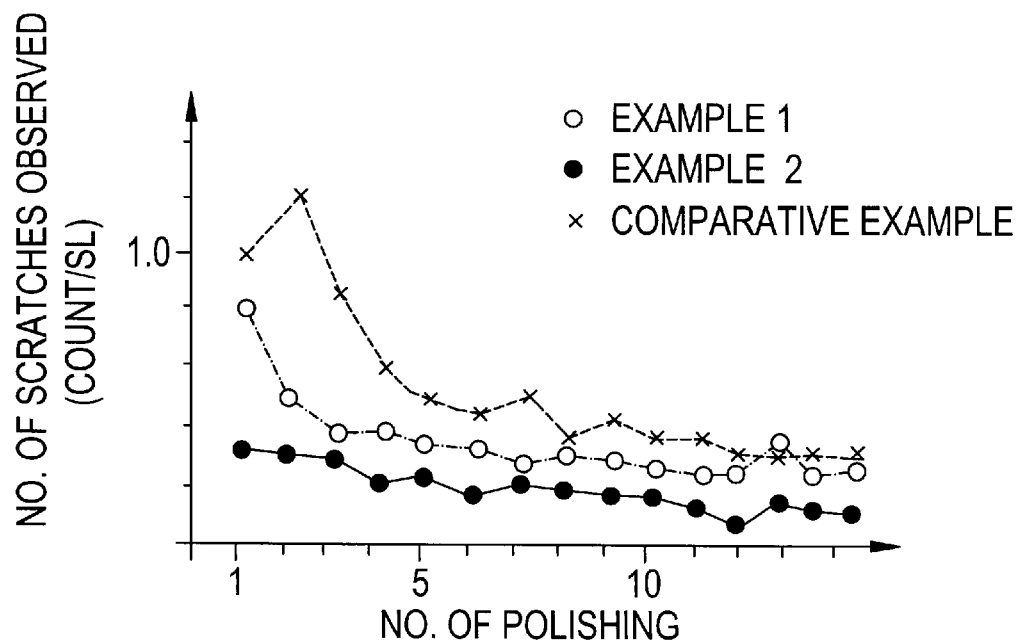
FIG. 4 is a graph showing a correlation between number of polishing and rate of occurrence of scratches.

A correlation between number of polishing steps on the wafer and rate of occurrence of scratches in shown in FIG. 4.

A carrier 3 was stored, by the use of the vessel 13 shown in FIG. 1 in such a manner that it was completely immersed in a liquid mixture having a temperature of 40° C. and pH of about 10 while circulating a filter-cleaned mixed liquid by a filter 10 (1.0 $\mu$m filtration filter).

The liquid mixture was prepared by adding 0.5 wt % of L-64 (produced by BASF) as a surface active agent, 0.5 wt % of 30% aqueous ammonia, and 0.5 wt % of 30% aqueous hydrogen peroxide (based on total weight of deionized water in the resulting mixture) to deionized water.

Then, a silicon wafer was subjected to polishing (normal manner) several times on both surfaces simultaneously by the use of the aforementioned carrier.

A correlation between number of polishing steps on the wafer and rate of occurrence of scratches is shown in FIG. 4.

Figure 3:
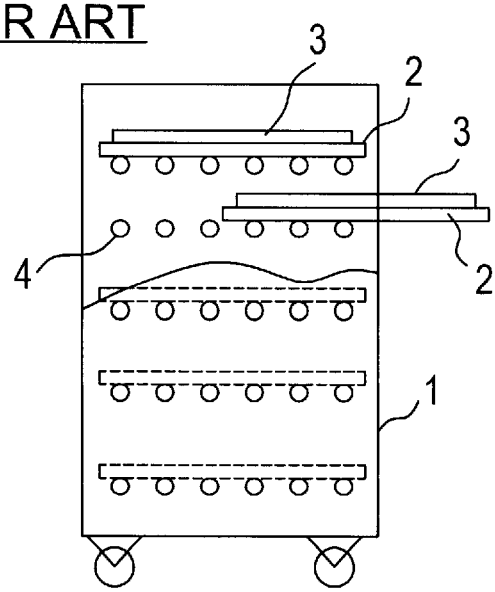
FIG. 3 is a schematic explanatory view showing an embodiment of a conventional method for storing a carrier.

A carrier 3 was stored in a dry condition by the use of a container 1 for storing a carrier shown in FIG. 3.

A silicon wafer was subjected to polishing (normal manner) several times on both surfaces simultaneously by the use of the carrier.

A correlation between number of polishing steps on the wafer and rate of occurrence of scratches is shown in FIG. 4.

As FIG. 4 shows, the rate of occurrence of scratches on a silicon wafer was reduced in Examples 1 and 2 in comparison with Comparative Example.

Further in Example 2, a rate of occurrence of scratches on a silicon wafer was reduced the most by adding a surface active agent, aqueous ammonia and aqueous hydrogen peroxide to deionized water in comparison with the case where only deionized water was used.

As is clear from the above description, according to the present invention, a carrier can be stored in a clean condition, and scratches on a silicon wafer which are sustained during polishing of the silicon wafer on both surfaces simultaneously can be reached.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A method for storing a carrier used in polishing a silicon wafer, characterized in that said carrier is stored completely immersed in a liquid containing deionized water, removed from said liquid and used to hold the silicon wafer as said wafer is polished.

2. A method as set forth in claim 1, characterized in that said liquid has a temperature in the range of about 20° C. through about 80° C.

3. A method as set forth in claim 2, characterized in that said liquid is subjected to filter-circulation cleaning.

4. A method as set forth in claim 3 wherein said liquid is substantially entirely deionized water.

5. A method as set forth in claim 4 wherein said wafer is simultaneously polished on both sides.

6. A method as set forth in claim 1 wherein said liquid is a mixture including deionized water as a substantial portion thereof.

7. A method as set forth in claim 6 wherein said mixture includes a surface active agent in the range of about 0.1–5% by total weight of deionized water in the mixture.

8. A method as set forth in claim 6 wherein said mixture includes aqueous ammonia and hydrogen peroxide.

9. A method as set forth in claim 6 wherein said mixture includes aqueous ammonia, hydrogen peroxide and surface active agent, each in the range of about 0.1–5% by total weight of deionized water in the mixture.

10. A method as set forth in claim 8 wherein said mixture has a pH of about 7–12.

11. A method as set forth in claim 9 wherein said mixture has a pH of about 7–12.

12. A method as set forth in claim 6 wherein said mixture has a temperature in the range of about 20° C. through about 80° C.

13. A method as set forth in claim 12 wherein said mixture is subjected to filter-circulation cleaning.

* * * * *